(12) United States Patent
Bagg (10) Patent No.: US 8,594,144 B1
(45) Date of Patent: Nov. 26, 2013

(54) PUMP DIODE DRIVER CIRCUIT (75) Inventor: Charles G. Bagg, Fitchburg, MA (US)

(73) Assignee: L-3 Insight Technology Incorporated, Londonderry, NH (US)

( * ) Notice: Subject to any disclaimer, the term of this patent is extended or adjusted under 35 U.S.C. 154(b) by 521 days.

(21) Appl. No.: 12/774,915

(22) Filed: May 6, 2010

Related U.S. Application Data (60) Provisional application No. 61/176,245, filed on May 7, 2009, provisional application No. 61/183,213, filed on Jun. 2, 2009.

(51) Int. Cl.
*H01S 3/00* (2006.01)

(52) U.S. Cl.
USPC .................. 372/38.02; 372/25; 372/38.06

(58) Field of Classification Search
USPC ................................ 372/25, 38.02
See application file for complete search history.

(56) References Cited

U.S. PATENT DOCUMENTS

| | | | | |
|---|---|---|---|---|
| 5,696,781 | A * | 12/1997 | Hyuga | 372/21 |
| 2006/0291512 | A1 * | 12/2006 | Borschowa | 372/38.02 |
| 2008/0129270 | A1 * | 6/2008 | Kawk et al. | 323/288 |

* cited by examiner

*Primary Examiner* — Xinning Niu (57) ABSTRACT

A laser marker/designator has an energy storage and conversion circuit providing a constant input current to a solid state pulsed pump diode.

6 Claims, 6 Drawing Sheets

PUMP DIODE DRIVER CIRCUIT

CROSS-REFERENCE TO RELATED APPLICATIONS

This application claims the benefit of U.S. provisional patent application Ser. No. 61/176,245 filed May 7, 2009 and Ser. No. 61/183,213 filed Jun. 2, 2009. The entire disclosures of which are incorporated herein by reference in their entirety.

BACKGROUND OF THE INVENTION

Soldiers may use laser markers and designators to identify targets of interest and are often used in conjunction with laser-guided weapons. The soldier may direct the laser energy at the target and the reflected energy may be detected by another soldier on the ground or in an aircraft, with or without electro-optical equipment. A marker may be used to identify a target and once acquired the marker may be turned off and the soldier can move on to another target and a designator may be used to identify a target, but may require the soldier to keep the designator directed at the target to guide the weapon in. The same device may be used as both a marker and a designator. The marker/designator may operate in the infrared spectrum and may be coded to help distinguish it from another marker/designator.

BRIEF DESCRIPTION OF THE DRAWINGS

For a better understanding of the present invention, together with other objects, features and advantages, reference should be made to the following detailed description which should be read in conjunction with the following figures wherein like numerals represent like parts.

DETAILED DESCRIPTION

Figure 1:
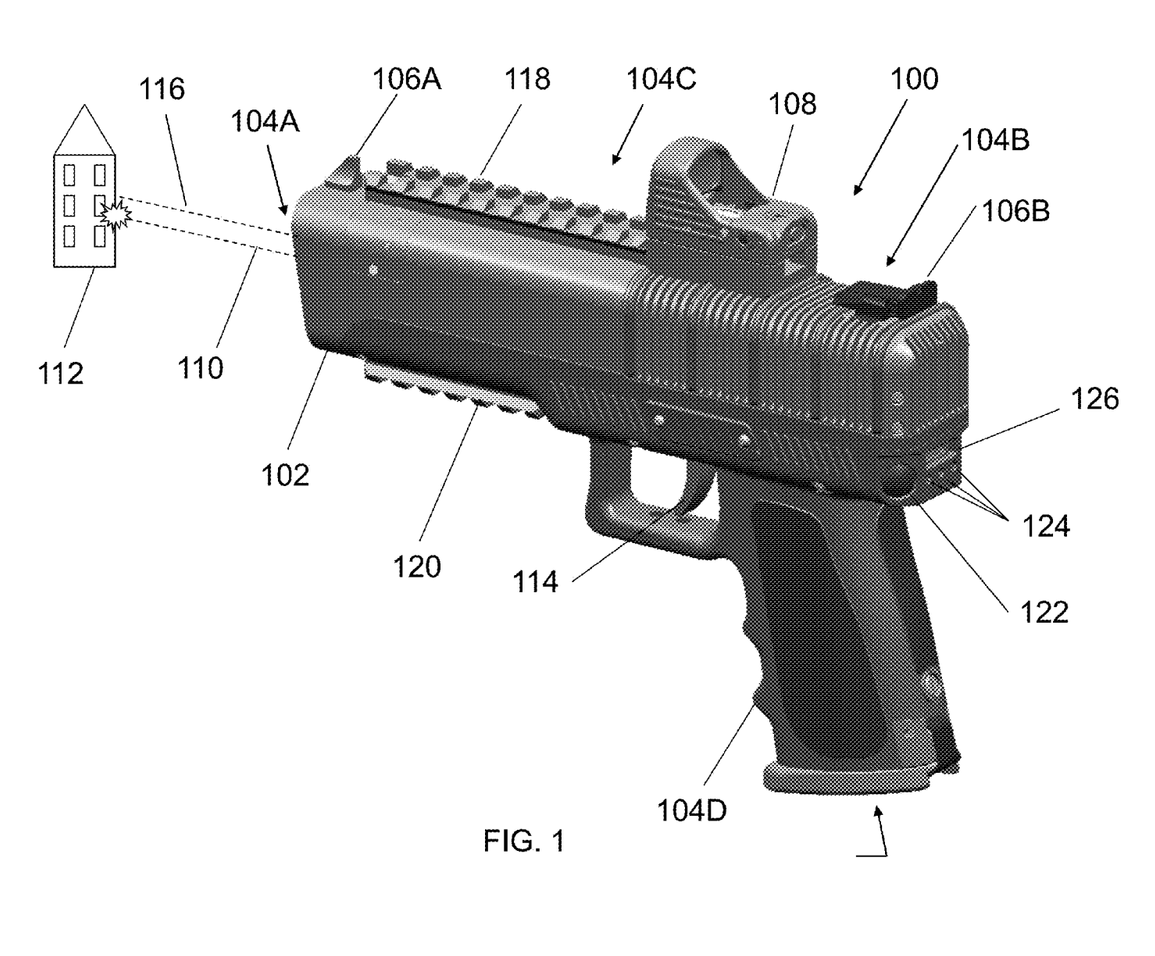
FIG. 1 is an isometric view of a laser designator/marker consistent with a first embodiment of the invention.

FIG. 1 is an isometric view of a laser designator/marker 100 consistent with a first embodiment of the invention. The laser designator/marker 100 may have a housing 102 to provide protection to internal components from unintended contact or debris. The housing 102 may have a first section of rail 118, for example a rail in accordance with MIL-STD-1913, and a second section of rail 120 for mounting accessories. The housing 102 may be in a variety of shapes including the shape of a handgun having a handle portion 104D. The device 100 may have an output end 104A and a laser cavity end 104B. Using mechanical sights 106A, 106B, a reflect sight 108, or other alignment system, the user may aim the axis of a light output 110 at a target 112. The device 100 may have an actuator 114 to turn the laser on and off. A visible and/or infrared laser output 116 may be coaligned with the designator/marker laser output 110 to boresight the designator/marker laser output 110 with the mechanical sights 106A, 106B, the reflect sight 108, or other alignment system. A laser designator/marker in a different form factor may be tripod mounted, mounted on small arms such as the M4A1 carbine and other weapons, or mounted on a vehicle. A user may utilize an actuator 122 to turn on and off the visible or an infrared laser output 116 or to change the output code of the light output 110. One or more LEDs 124 or a display 126 may be used to communicate system information to the user.

When a user actuates the actuator 114, the collimated laser light output 110 may exit the laser device 100 through the output end 104A. The device 100 may have a principal operating frequency around 1064 nm, although other frequencies may be generated without departing from the invention. The laser light output 110 may be generated in the laser cavity end 104B and then may travel through output optics 218 (see FIG. 2), for example a beam expander, located in section 104C before leaving the device 100 through the output end 104A.

Figure 2:
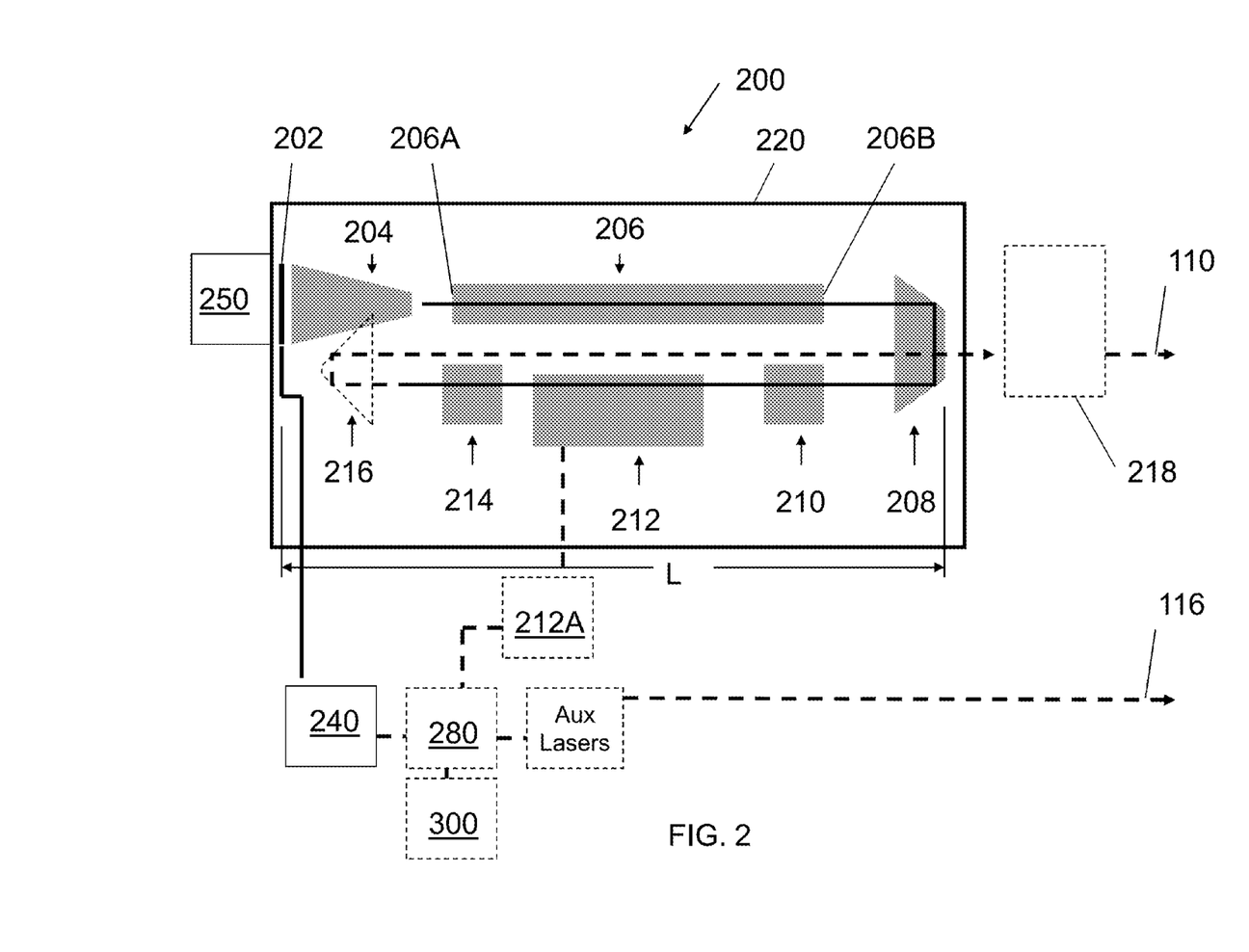
FIG. 2 is a block diagram of a laser assembly consistent with a second embodiment of the invention for use in the laser designator/marker of FIG. 1.

FIG. 2 is a block diagram of a laser assembly 200 consistent with a first embodiment of the invention for use in the laser designator/marker 100 of FIG. 1. The laser assembly 200 may have a diode array 202, a concentrator 204, a crystal 206, a first light turning element 208, a polarizer 210, a Q-switch crystal 212, an output coupler 214, and a second light turning element 216. The Q Switch crystal 212 may be driven by a Q Switch driver 212A. These components may be coupled to an optical bench 220 in the laser cavity end 104B. The laser light output may be produced using a multi-color diode array, for example a three color diode array. The multiple wavelengths produced by the diode array 202 may be matched to peaks in the crystal absorption spectrum of the crystal 206. The diode wavelengths may shift over temperature, however, having multiple wavelengths spanning the absorption spectrum may allow the system to better tolerate these temperature shifts. The light produced by the diode array 202 may be emitted over a large cross sectional area and have a rapid divergence in one axis. The concentrator 204 may be used to capture this light and funnel it down into a smaller cross sectional area of an input face 206A of the crystal 206 using total internal reflections. The crystal 206 may be a Nd:YAG slab that absorbs the energy of the 810 nanometer light, stores the energy for a time, and later releases the stored energy as light at 1064 nanometers. The Nd:YAG slab may also be responsible for creating the florescence which seeds the laser pulses. Other crystal material may be used without departing from the invention. The input face 206A may be coated to allow the 810 nanometer light from the diode array 202 into the slab while preventing any of the 1064 nanometer light from leaving the slab. An output end 206B of the crystal 206 may be coated to allow all of the 1064 nanometer light to leave the slab. The first light turning element 208 may have an anti-reflective (AR) coating 1064 nanometers and allow the laser to be folded through total internal reflections, thereby reducing the overall length "L" of the laser cavity. The polarizer 210 may linearly polarize the 1064 nanometer light produced in the Nd:YAG slab and allow the Q-switch crystal 212 to act as a shutter facilitating Q-switch, or short pulse, operation. The output coupler 214 may be coated to have a 50 percent reflectivity at 1064 nanometers. This may provide feedback for the pulse build up in the laser while allowing some of the pulse energy to escape the laser. As the pulses circulate through the laser they are amplified with each pass through the Nd:YAG slab until the energy stored in the slab is depleted. The high reflectivity coating on the input face of the Nd:YAG slab and the 50 percent reflectivity coating on the output coupler 214 may provide the feedback required to keep the pulses circulating during this time. The Q-Switch crystal may act as a shutter in combination with the polarizer 210 and the output coupler 214. While the shutter is closed the gain is allowed to build in the Nd:YAG slab. Once the shutter is opened the pulse builds rapidly until the gain is sufficiently depleted. The shutter action results from the polarization rotation created by the Q-switch output coupler combination. This may be accomplished by keeping the Q-switch biased at the quarter wave voltage. The rotated polarization may then be rejected by the polarizer and is unable to provide feedback into the slab. Once the gain has built up, the Q-switch crystal 212 may be reverse biased to 1 kilovolt. This reverse bias allows the pulse to form more quickly than if the quarter wave bias had just been removed. Switching the Q-switch allows the 1064 nanometer light to move through the Q-switch output coupler combination without being rotated from its original polarization state thus providing the feedback required for the pulse to form. The second light turning element 216 allows the laser to be folded a second time sending the laser beam over the top of all the laser optics and out through the beam expander 218. This 2-fold concept allows the laser to have a very compact footprint while still maintaining pulse energy needed to meet the system requirements.

The diode array 202 may be thermally coupled to the heatsink 250 at the rear portion of the laser cavity end 104B of the housing. Having the second light turning element 216 allows the light to exit the device 100 without having an opening in the heatsink 250 through which the light can pass.

Figure 3:
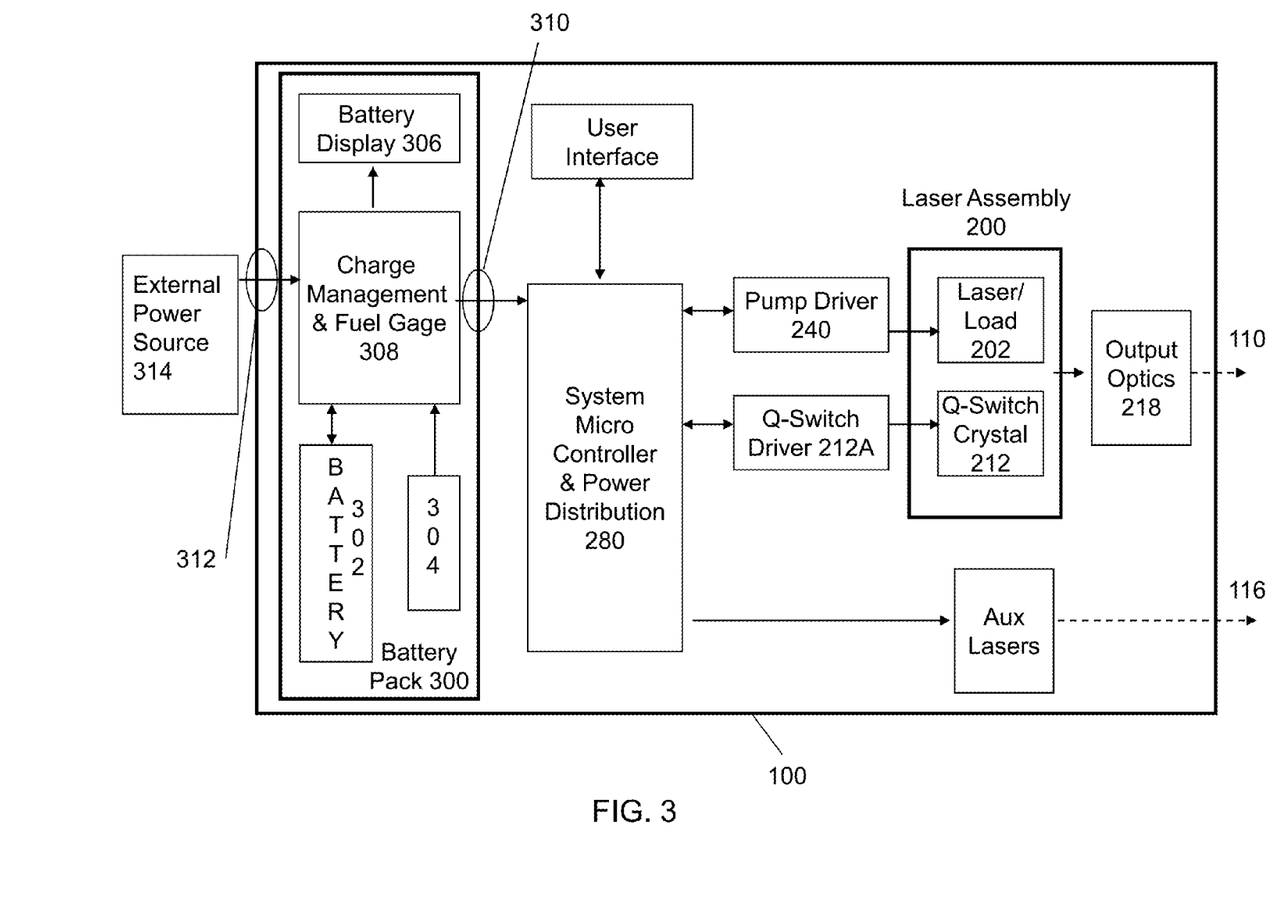
FIG. 3 is a block diagram of the laser designator/marker of FIG. 1 consistent with a third embodiment of the invention.
Figure 4A:
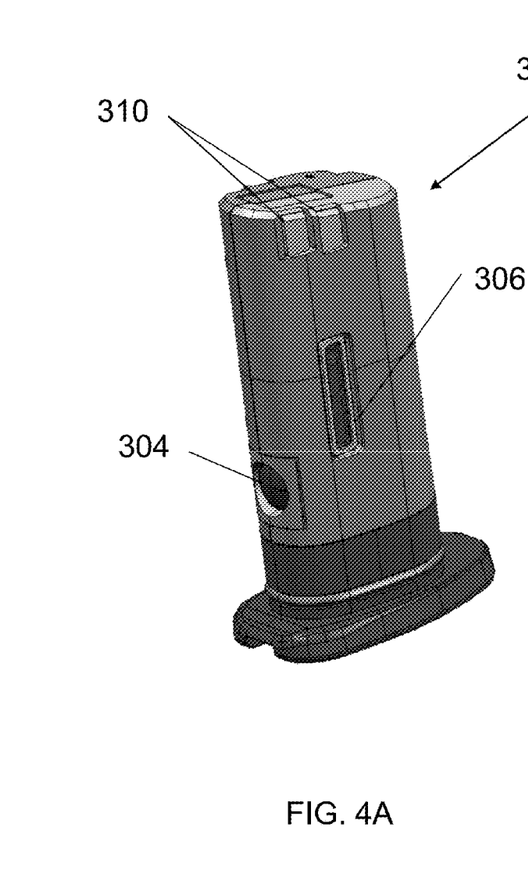
FIG. 4A is a first isometric view of a battery pack.
Figure 4B:
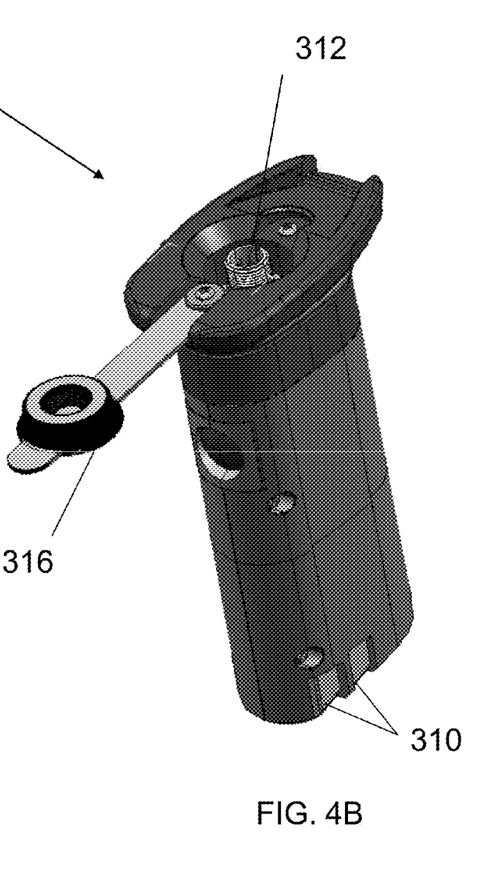
FIG. 4B is a second isometric view of the battery pack of FIG. 4A.

FIG. 3 is a block diagram of the laser designator/marker 100. The laser designator/marker 100 may be powered by a removable, replaceable battery pack 300 (See FIG. 4A, 4B). The battery pack 300 may have a battery 302, an actuator 304 for causing the charge management and fuel gauge 308 to display a representation of the amount of available energy in a display 306, a connector 312 for connecting to an external power source 314, and a set of contacts 310 for connection to a system micro controller and power distribution circuit 280. The battery 302 may be a NI/Cad, Li-ion, NiMH or other type of battery without departing from the invention. The display 306 may be a plurality of light emitting diodes, a liquid crystal display or other electronic device for visually or audibly representing the percentage of available energy in the battery 302. The charge management and fuel gauge 308 may be capable of displaying the amount of available energy as long as the actuator 304 is actuated or for a predetermined period of time, for example 3 seconds. The charge management and fuel gauge 308 may be capable of accepting a range of input DC voltages and currents. The charge management and fuel gauge 308 may be capable of accepting power from a variety of sources including but not limited to batteries for example a BA-5590 (12-24 VDC) military battery, a CR-123 battery box (12-24 VDC), a vehicle for example a military vehicle, or an external AC adapter which may be capable of converting AC power to DC power. The charge management and fuel gauge 308 may utilize a Maxim Integrated Products Stand-Alone Fuel Gauge IC with LED Display Driver with characteristics of the battery 302 stored in an EEPROM. The battery 302 may be charged by placing the battery pack 300 in a cooperating cradle or may be charged in/or out of the laser designator/marker 100 through the connector 312.

Figure 5A:
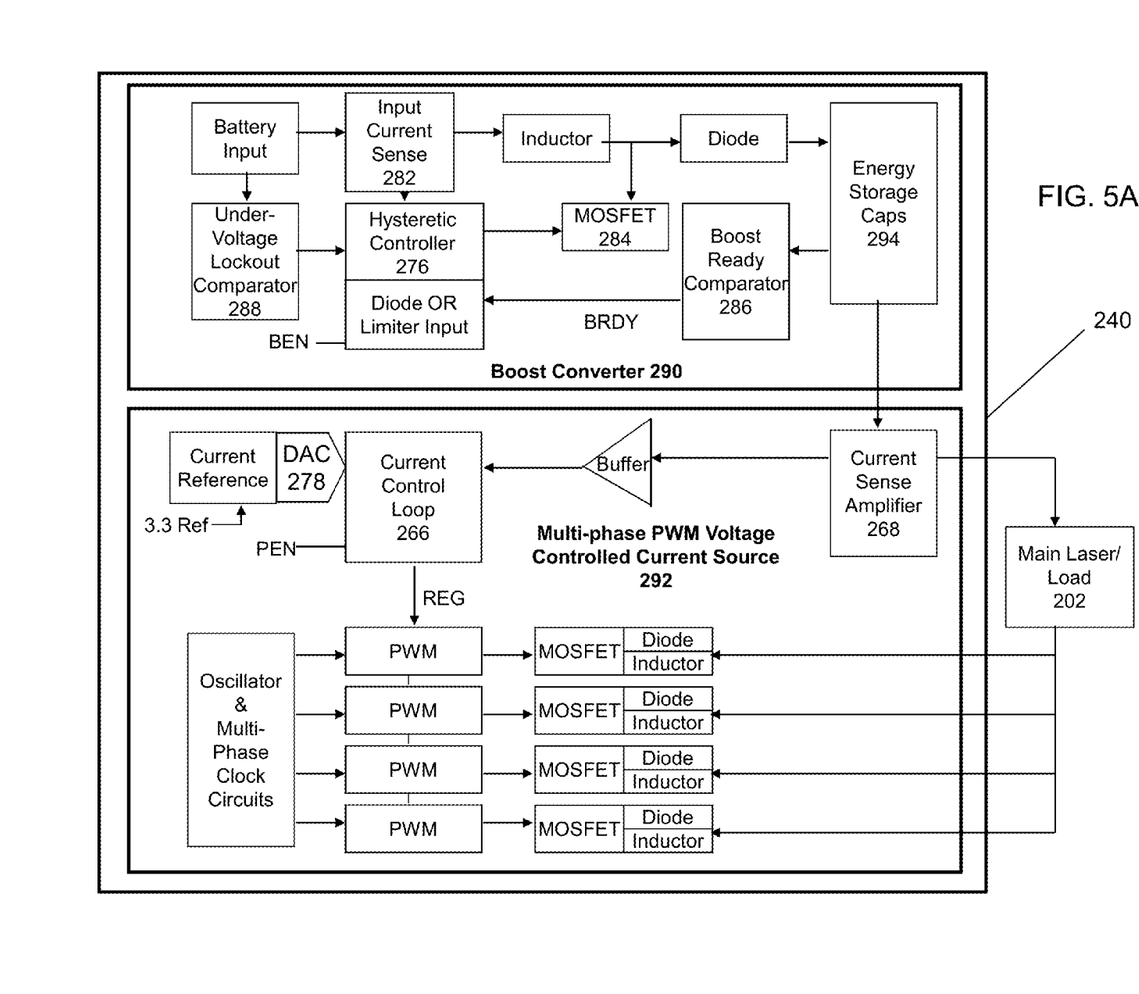
FIG. 5A is a block diagram of a pump driver circuit consistent with a fourth embodiment of the invention.
Figure 5B:
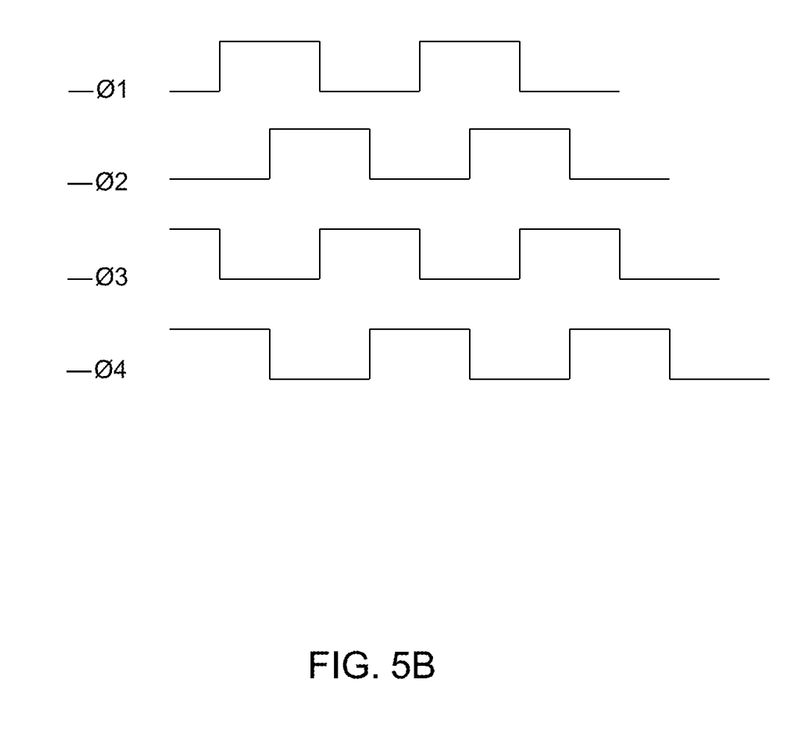
FIG. 5B is a timing diagram for the pump driver circuit of FIG. 5A.

FIG. 5A is a block diagram of a pump driver circuit 240 and FIG. 5B is a timing diagram for the pump driver circuit of FIG. 5A. The pump driver circuit 240 may include a boost converter 290 and a multi-phase pulse-width modulated (PWM) voltage controlled current source 292 capable of providing a controlled current pulse of up to 200 A at up to 300 uS, at a 20 Hz repetition rate, with a diode forward voltage of about 25V, to the diode array 202. The circuit is capable of being scaled up or down without departing from the invention. The boost converter 290 may raise the battery 302 voltage from 3V to 48V, charging up a bank of energy storage capacitors 294 to store enough energy to deliver a pump pulse. The anode of the load (pump diode) may be connected to the 48V, and the cathode may be driven toward ground by a four-phase PWM circuit. The pulse width may be modulated to provide a constant controlled current pulse through the main load, for example the diode array 202, even as the capacitor voltage is dropping from 48V to as low as 32V.

Controller chips are typically designed to regulate their output voltage, and will rapidly vary their input current over a wide range as needed to maintain the output under varying load conditions and typically have a very high inrush current at startup. In this embodiment, the output is not regulated, as the boost converter 290 is designed to charge up the bank of energy storage capacitors 294 to the specified voltage and then shut off. Instead of regulating its output voltage, in this embodiment the system micro controller and power distribution circuit 280 regulate its input power to the lowest level necessary to recharge the bank of energy storage capacitors 294 in just under a predetermined period of time, for example 50 mS. This approach can eliminate repetitive inrush currents after each pulse.

A hysteretic controller circuit 276 may use a 2.5V reference, a high side current sense amplifier, a fast comparator, and a MOSFET driver with low propagation delay. The boost converter 290 may utilize a conventional low side MOSFET switch, inductor, an output diode, and the energy storage capacitors 294.

When the hysteretic controller circuit 276 is enabled by boost enable signal (BEN), the MOSFET 284 turns on, and current ramps up through the inductor to a preset upper limit. The MOSFET 284 switch then turns off and the current ramps down to a lower limit as determined by the hysteresis in the input current sense circuit 282. The input current then oscillates between these two values until the bank of storage capacitors 294 are fully charged. As the output voltage increases, the current ramps down much faster than it ramps up, which is why a very fast comparator and FET driver is desired in order to keep the average input current constant.

While only BEN can turn the boost converter 290 on, three things can turn it off. When the output reaches 48V, the boost ready comparator 286 trips and shuts it off, and outputs the boost ready (BRDY) signal to the system. If the battery voltage gets too low, the hysteretic controller circuit 276 would try to draw excessive current, so the under-voltage lockout comparator 288 will turn it off. Both comparators 286, 288 have hysteresis to insure that the boost converter 290 stays off until there is a significant change in the input or output voltage. Open drain comparators would allow the outputs to be wire-OR connected, but could make accurate hysteresis very difficult. Thus, push-pull comparators may be used with output diodes to OR the signals. Finally, the pump enable (PEN) signal disables the boost converter 290 to prevent it from running during the pump pulse. This is to prevent noise from the boost circuit from possibly disrupting the pump control loop 266.

The input current sense circuit 282 can measure the high side current so it can monitor both the up-ramp and down-ramp in the inductor. A conventional differential amplifier circuit measures the small voltage across a current sense resistor, except that the input resistors are deliberately mismatched. Since each pump pulse takes the same amount of energy out of the caps, the boost circuit must replace that amount of energy on each cycle. As the battery voltage gradually decreases, the current must increase to deliver the same energy in the given time. With matched resistors, the differential amplifier would ignore the common mode voltage. With the correct amount of mismatch, the common mode voltage "error" compensates the input current sense circuit, causing it to draw higher current at lower voltage, for a relatively constant input power.

Each phase of the PWM circuit may include a fast comparator, MOSFET driver, power MOSFET, current sense resistor, inductor, and commutating diode. The driver chips are normally disabled for safety until the PEN signal arrives. A symmetrical 5V square wave may be fed through a 2K resistor to the inverting input of the comparator. It may be converted to a triangle wave by a capacitor to ground, and attenuated by a 5K resistor going to the current sense resistor. The negative peaks of the triangle wave may be slightly above ground. The current regulator (REG) signal is fed through a 2K resistor to the non-inverting input of the comparator, and a positive feedback resistor provides hysteresis. REG is normally at ground, keeping the comparator output low. When REG gradually goes high, it becomes more positive than the negative peaks of the triangle wave, causing the comparator output to pulse high. The pulses go to the driver chip, causing the MOSFET to pulse on, ramping up the inductor current. As REG goes more positive, the pulse width increases, delivering more current to the cathode of the pump diode. Each time the MOSFET turns off, the inductor current continues to flow in its associated commutating diode as it ramps down, delivering a relatively smooth current.

Since inductors typically do not have tight tolerances, some phases of the PWM might deliver more or less current than others. To balance the phases, a low value current sense resistor develops a small correction voltage that is added to the triangle wave. A slight increase in current will raise the triangle wave relative to REG, reducing the pulse width proportionally.

The current control loop 266 may include a high-side current sense amplifier, a buffer, and an error amplifier/integrator. In this embodiment, the output of the current sense amplifier 268 is 2V full scale at 200 A. Its output impedance is not low enough to drive the error amplifier, so it is first fed to a unity gain buffer stage, and then to the negative input of the error amp. The error amplifier is basically a "leaky integrator" which doubles as a unity gain voltage follower. The resistor in parallel with the integrating capacitor provides a leakage path so that complex clamps or limiters are not needed to prevent the integrator from getting "stuck" at either rail. The resistor in series with the integrating capacitor provides some AC gain to improve loop response.

A 3.3V Reference may run a current adjust DAC 278. Alternatively, the DAC may be replaced with an onboard manual trim-pot. The DAC (or trim-pot) output is attenuated by a resistive divider to 2V max at the positive input of the integrator, and it is slowed down by a cap to provide the desired soft start rise time. This signal is shorted to ground by a small MOSFET until PEN arrives. The inverted pump enable ($\overline{PMP}$) turns off the MOSFET, allowing the plus input to rise. The voltage follower function noted above may cause the integrator output to rise as well. The output of the integrator provides the REG signal to the PWM phases. The input current sense circuit 282 output voltage increases until it equals the reference voltage, thereby regulating the current at the correct level. If the current tries to go too high or too low, the integrator will regulate it to the proper level. During the pump pulse, the capacitor voltage decreases at about 200 mV per microsecond, and the integrator must be fast enough to keep the current constant. If it is too fast, it may overcompensate and the loop may oscillate.

The clock may start with a simple oscillator based on a Schmidt trigger inverter. It may be divided down by a D-flop to make it a symmetrical square wave, and the Q and Q-bar outputs are further divided down by two more D-flops to produce the four phases. It is important for the four clock phases to be accurately generated to allow current balance in the phases. In a lower power two phase version, the last D-flop would not be used. Producing a three phase version would require a different clock circuit to create a 120 degree phase shift instead of the existing 90 degrees.

Although reference is made to a soldier, the present invention has applications outside of military applications.

Although several preferred embodiments of the present invention have been described in detail herein, the invention is not limited hereto. It will be appreciated by those having ordinary skill in the art that various modifications can be made without materially departing from the novel and advantageous teachings of the invention. Accordingly, the embodiments disclosed herein are by way of example. It is to be understood that the scope of the invention is not to be limited thereby.

What is claimed is:

1. A portable battery-powered laser marker/designator, comprising:
    a solid state pulsed pump diode having a forward voltage;
    an energy storage and conversion circuit having
        a constant input current boost converter to raise a first voltage from a battery to a second voltage higher than the forward voltage of the pump diode;
        a capacitor, and
        a programmable high current multi-phase buck converter,
        the boost converter configured to charge the capacitor up to the second voltage with sufficient stored energy to provide at least one pump pulse without causing the second voltage to drop below the forward voltage of the pump diode,
        the programmable high current multi-phase buck converter configured to operate as a pulsed voltage controlled current source that can discharge the capacitor through the pump diode with a program-controlled current and pulse width.

2. The laser marker/designator of claim 1, whereby each phase of the buck converter includes a pulse width modulator circuit, a first solid state power switch, an inductor, and a second solid state power switch.

3. The laser marker/designator of claim 1, wherein an input current to the boost converter is configured to maintain a constant level that will minimize loading of the battery and in which there is no repetitive inrush current each time the capacitor is recharged.

4. The laser marker/designator of claim 1, wherein the boost converter further comprises a voltage sensing and control circuit configured to turn off the boost converter if:
    the first voltage from the battery is below a useable level;
    the capacitor has been charged to a programmed level; or
    the multi-phase buck converter is delivering energy to the pump diode.

5. The laser marker designator of claim 1, wherein the multi-phase buck converter further includes a synchronized multiphase clock generator to drive each of said pulse width modulator circuits with approximately the same pulse width; current sense means for each phase; independent pulse width adjustment means for each phase responsive to said current sense means, such that each phase of said multi-phase buck converter will deliver essentially the same current.

6. The laser marker/designator of claim 1, wherein the multi-phase buck converter further comprises an overall current sense circuit, a closed loop control circuit responsive to the overall current sense circuit, a pulse width control circuit responsive to the closed loop control circuit such that the overall current supplied to the pump diode is controlled.

* * * * *